United States Patent
Smith, Jr. et al.

(10) Patent No.: US 6,600,202 B1
(45) Date of Patent: *Jul. 29, 2003

(54) COMPACT SENSING APPARATUS HAVING REDUCED CROSS SECTION AND METHODS OF MOUNTING SAME

(75) Inventors: Marshall E. Smith, Jr., Eaton Park, FL (US); Peter U. Wolff, Winter Haven, FL (US); Richard W. Stettler, Winter Haven, FL (US)

(73) Assignee: Wolff Controls Corporation, Winter Haven, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/680,722

(22) Filed: Oct. 6, 2000

Related U.S. Application Data

(63) Continuation of application No. 09/321,191, filed on May 27, 1999, now Pat. No. 6,187,609, which is a division of application No. 08/954,196, filed on Oct. 20, 1997, now Pat. No. 6,002,252, which is a continuation-in-part of application No. 08/760,104, filed on Dec. 3, 1996, now Pat. No. 5,738,071, which is a continuation-in-part of application No. 08/471,192, filed on Jun. 7, 1995, now Pat. No. 5,670,886, which is a continuation-in-part of application No. 07/703,269, filed on May 22, 1991, now Pat. No. 5,459,405.

(51) Int. Cl.[7] ............................................. H01L 29/82

(52) U.S. Cl. ................... 257/422; 257/414; 257/415; 257/416; 257/417; 257/421; 257/425; 257/427; 438/64; 438/66; 438/67; 438/74; 438/78; 438/48; 438/51; 73/862; 324/252

(58) Field of Search .......................... 257/414, 415, 257/416, 417, 421, 422, 425, 427; 438/64, 66, 67, 74, 78, 48, 51; 73/862; 324/252

(56) References Cited

U.S. PATENT DOCUMENTS

| | | | | | |
|---|---|---|---|---|---|
| 3,737,740 | A | * | 6/1973 | Yamada et al. | 317/235 |
| 3,848,217 | A | * | 11/1974 | Lazzari | 338/32 |
| 4,008,398 | A | * | 2/1977 | Schramm et al. | 250/372 |
| 4,030,347 | A | * | 6/1977 | Norris et al. | 73/88.5 |
| 4,319,397 | A | * | 3/1982 | Tanabe et al. | 29/589 |

(List continued on next page.)

FOREIGN PATENT DOCUMENTS

| | | | | |
|---|---|---|---|---|
| EP | 0390548 | | * 10/1990 | 257/415 |
| EP | 0643215 | A2 | 3/1995 | |
| EP | 0894965 | A1 | 2/1999 | |
| EP | 0911507 | A2 | 4/1999 | |
| GB | 2230874 | | 10/1990 | |

*Primary Examiner*—Eddie Lee
*Assistant Examiner*—Edgardo Ortiz
(74) *Attorney, Agent, or Firm*—Allen, Dyer, Doppelt, Milbrath & Gilchrist, P.A.

(57) ABSTRACT

A compact sensing apparatus having reduced cross section and methods are provided for sensing the magnitude and direction of an electrical or magnetic field. The compact sensing apparatus and method preferably provide one of two transducer orientations in relation to the direction of the field arranged in the sensor apparatus to provide the smallest possible cross section. The compact sensing apparatus preferably includes a plurality of mounting pins. Each of the plurality of mounting pins preferably includes a first pin portion and a second pin portion connected to the first pin portion at a predetermined angle. The predetermined angle is preferably less than 180 degrees and more preferably in the range of about 70–110 degrees. A transducer formed from a semiconductor wafer is preferably mounted to the first pin portion for generating a transducer signal, and a signal conditioner also preferably formed from the same semiconductor wafer is mounted to the second pin portion for conditioning the transducer signal.

8 Claims, 6 Drawing Sheets

U.S. PATENT DOCUMENTS

| | | | |
|---|---|---|---|
| 4,397,285 A | | 8/1983 | O'Neill |
| 4,401,966 A | * | 8/1983 | Ohmura et al. ............... 338/32 |
| 4,665,610 A | * | 5/1987 | Barth ......................... 29/580 |
| 4,667,391 A | * | 5/1987 | Chapuy et al. ............... 29/576 |
| 4,670,092 A | * | 6/1987 | Motamedi ................... 156/643 |
| 4,795,934 A | * | 1/1989 | Rogerson et al. ........... 310/313 |
| 5,035,035 A | * | 7/1991 | Rogerson et al. .......... 29/25.35 |
| 5,075,247 A | * | 12/1991 | Matthews ................... 437/52 |
| 5,210,714 A | * | 5/1993 | Pohl et al. ................... 365/157 |
| 5,271,406 A | * | 12/1993 | Ganguly et al. ........ 128/663.01 |
| 5,273,939 A | | 12/1993 | Becker et al. .............. 437/209 |
| 5,572,058 A | * | 11/1996 | Biard ......................... 257/421 |
| 5,706,780 A | | 1/1998 | Shirakawa |
| 5,729,128 A | * | 3/1998 | Bunyer et al. .............. 324/202 |
| 5,816,220 A | | 10/1998 | Stumpp et al. |
| 6,002,252 A | * | 12/1999 | Smith, Jr. et al. ........... 324/252 |

* cited by examiner

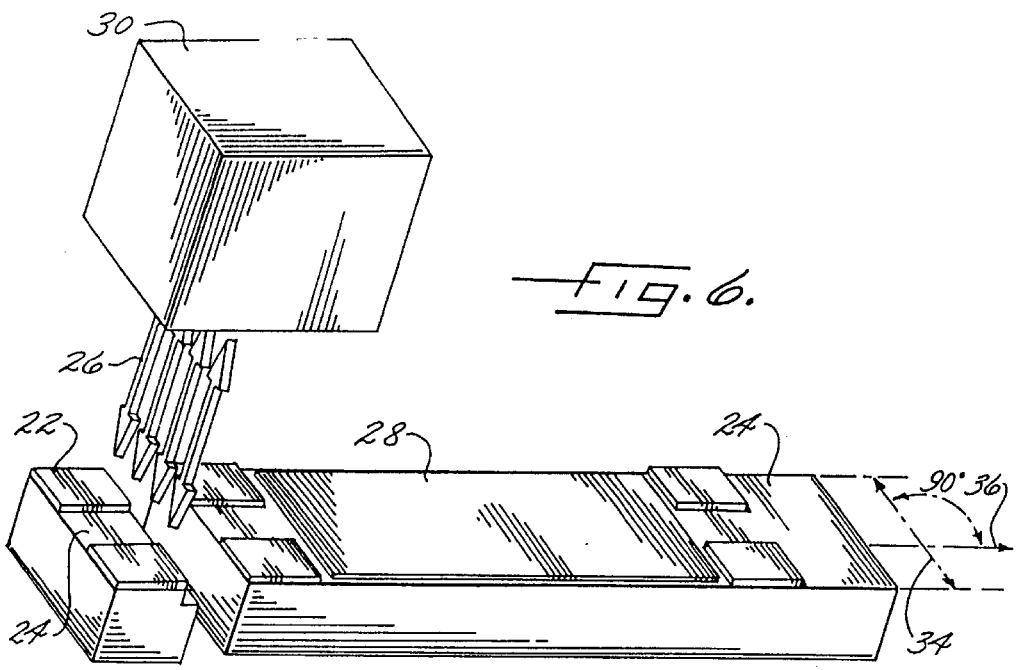
Fig. 6.
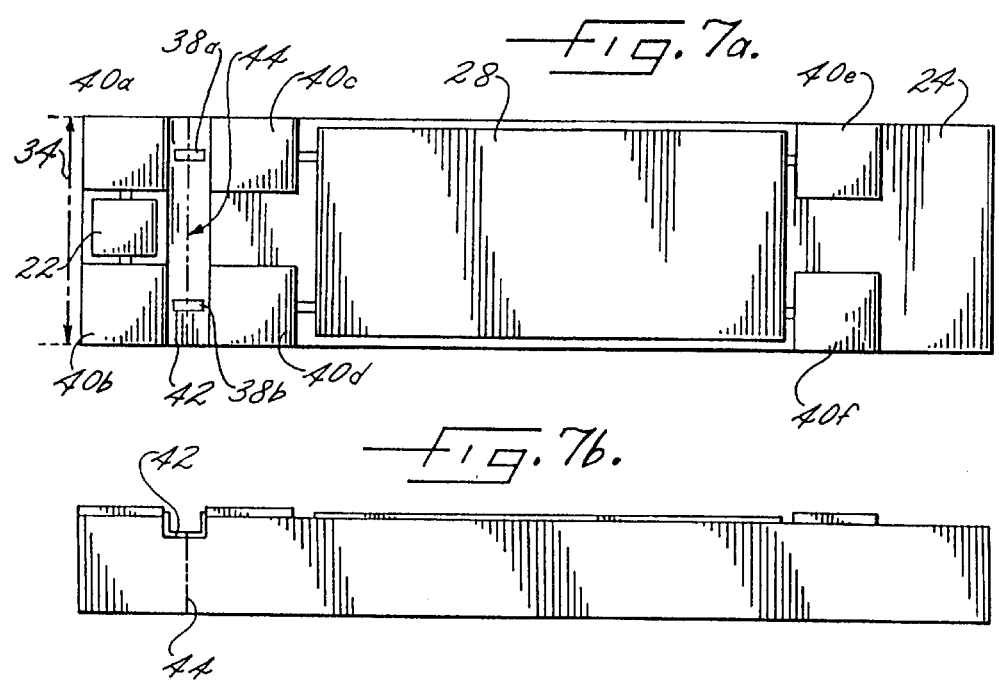
Fig. 7a.
Fig. 7b.

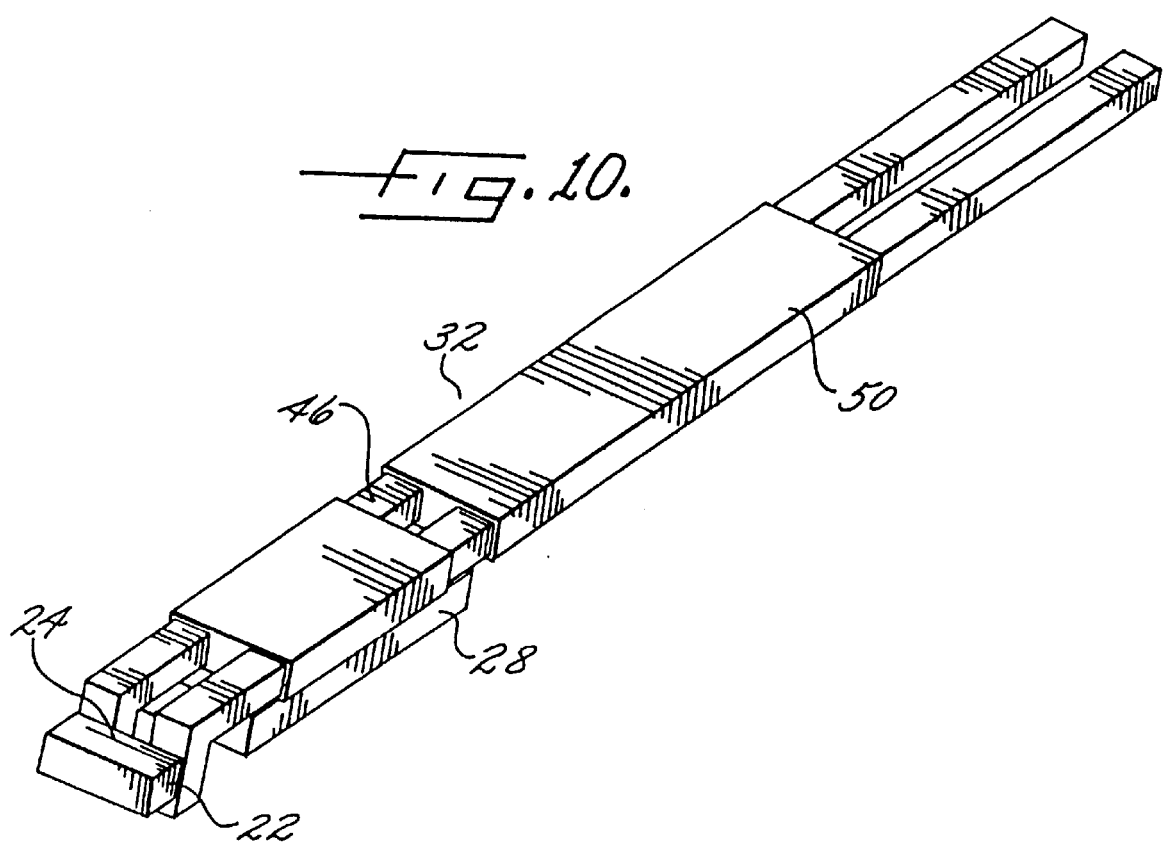
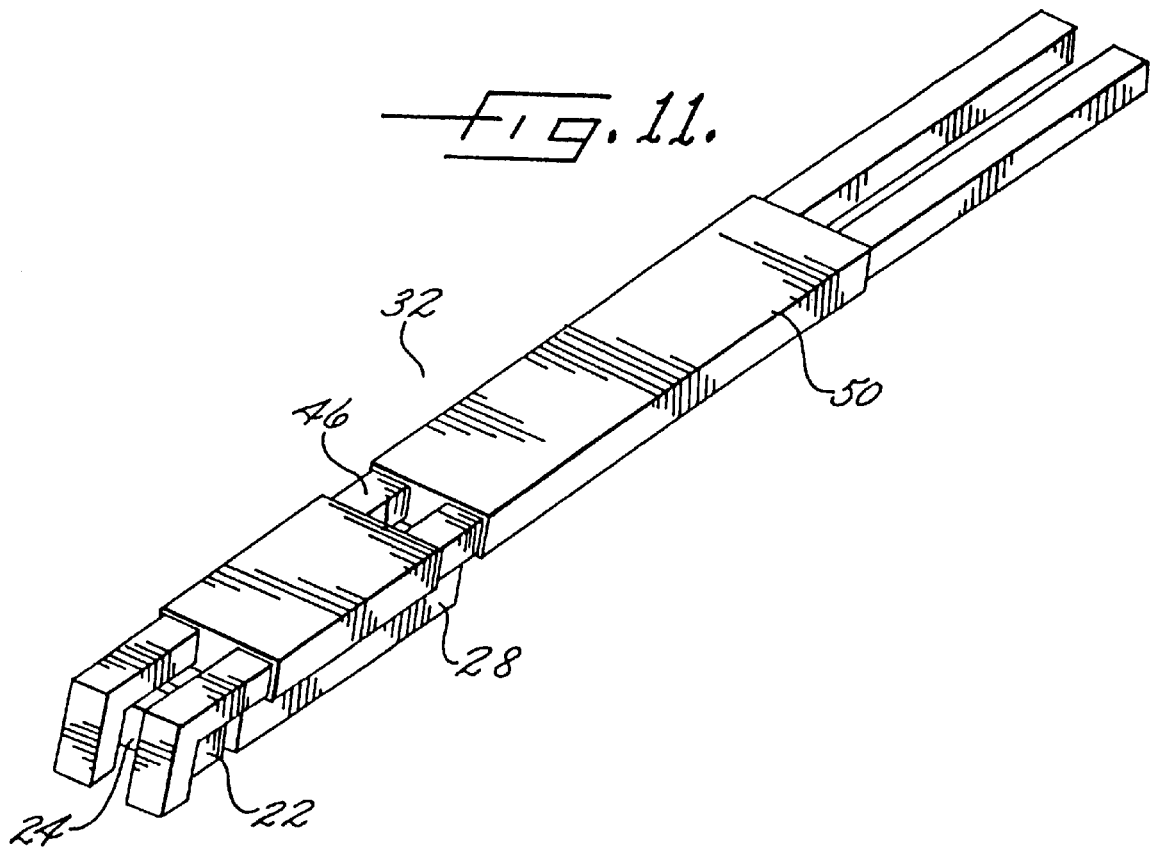

COMPACT SENSING APPARATUS HAVING REDUCED CROSS SECTION AND METHODS OF MOUNTING SAME

RELATED APPLICATIONS:

This patent application is a continuation of U.S. Ser. No. 09/321,191 filed May 27, 1999 U.S. Pat. No. 6,181,609, which is a divisional of U.S. Ser. No. 08/954,196 filed Oct. 20, 1997, now U.S. Pat. No. 6,002,252, which is a continuation-in-part of U.S. Ser. No. 08/760,104 filed Dec. 3, 1996, now U.S. Pat. No. 5,738,071, which is a continuation-in-part of U.S. Ser. No. 08/471,192 filed Jun. 7, 1995, now U.S. Pat. No. 5,670,886, which is a continuation-in-part of U.S. Ser. No. 07/703,269 filed May 22, 1991, now U.S. Pat. No. 5,459,405.

FIELD OF THE INVENTION

The present invention relates to the field of sensors and, more particularly to the fields of sensors and methods of mounting sensors.

BACKGROUND OF THE INVENTION

Over the years sensors have been developed which include transducers that possess a specific preferred orientation in relation to an electrical field, a magnetic field, or a mechanical force to be sensed. To maximize the response of the sensor, the transducer must be oriented in the direction of this field or force. Some examples of electrical or magnetic field sensors are position and proximity sensors such as Hall effect, magnetoresistor, capacitive, and inductive sensors and electrical current field sensors. Mechanical force sensors generally measure the flow or pressure of a liquid or gas, the mechanical stress or weight of an object, or the acceleration of an object. These sensors generally have a preferred orientation of the transducer to the electrical or magnetic field or to the physical force being sensed in order to maximize the sensitivity of the transducer.

Also, there may be other extraneous electrical or magnetic fields or mechanical forces in the system. The transducer may have to be oriented relative to these extraneous fields or forces in a specific direction to reduce the sensitivity of the transducer to them. This helps to eliminate sensing errors or noise caused by the movement of other objects or caused by the presence of other fields or forces.

These sensors also conventionally employ signal conditioning circuitry or a signal conditioner to amplify or otherwise condition the transducer signal. The signal conditioner is needed, for example, because the transducer signal is usually too low in magnitude to overcome noise or contains a large offset or other error signals that overdrive sensitive monitoring equipment. Otherwise, the transducer signal is not conducive to transmission over a distance to a remotely located sensor monitoring circuit.

Additionally, the sensors are often used in mechanical systems that have restrictions on overall size, weight, structural integrity, reliability, and cost. For these reasons, the sensor is usually made as small as possible by using transducers and signal conditioners that are electronic or that contain electrical devices manufactured on semiconductor wafers.

A first significant problem with transducers and signal conditioners which are manufactured as semiconductor devices, however, is that the electrical conductivity or other operating characteristics change significantly in response to changes in temperature. This can result in a significant change in transducer output as a function of temperature. Because most of the mechanical systems in which these sensors operate can experience rather significant changes in operating temperature, the effects of these temperature changes on the sensor output constitutes an error signal and should therefore be eliminated or reduced if possible.

The elimination of this error signal is usually a function of the signal conditioner and is usually accomplished in several related ways. The transducer and signal conditioner that are to be used together in any single sensor are usually manufactured at the same time using the same manufacturing process and are located as closely as possible in relation to each other on the same semiconductor wafer. This is done primarily to make the physical proportions of the components that comprise the transducer and the signal conditioner equal or proportional in width, length, and depth of features and to have equal relative concentrations of the various semiconductor materials used to form the components. For instance, all transistor bases, emitters, and collectors will be essentially the same relative size even if they are manufactured slightly larger or smaller than intended, and will have generally the same concentrations of materials regardless of whether they are at the intended levels of these various concentrations. The electrical conductivity of any particular electrical component in the transducer or the signal conditioner is proportional to the size of its features as well as the concentration of materials from which the component is manufactured. Any two components on the wafer located in close proximity to each other with the same dimensions and formed from the same relative concentrations of materials generally will have equal electrical conductivities if they are at the same temperature. Also, any component located near another component which has the same concentrations of materials but whose dimensions are not equal but are proportional to the other component will have an electrical conductivity that is proportional in the same degree as the dimensions if they are both at the same temperature. Because the size and composition of these components are set during manufacture, any short term changes in their electrical conductivity under identical electrical conditions are generally caused only by changes in the temperature of the component.

In this manner any specific component or collection of components on the transducer required for proper operation can be duplicated in the signal conditioner at the same size or at a specific proportional scale and with equal concentrations of materials. For example, some transducers employ four resistors in a Wheatstone bridge configuration. Any one or more of these resistors can be made with equal dimensions and with equal composition of materials on the signal conditioner. Under these conditions, the electrical conductivity of both pairs of resistors generally will be equal if their temperatures are equal. In any case, if the temperature of the transducer components is the same as the temperature of the signal conditioner components, both the transducer and signal conditioner will contain components that experience equal or proportional electrical conductivity due to the effects of temperature alone.

One of two methods are generally used in association with a signal conditioner to determine this change in electrical conductivity and then to produce a corresponding signal that cancels the effects of this change on the transducer output. First, if size allows, a complete duplicate of the transducer can be made on the signal conditioner. This duplicate transducer is then electrically, magnetically, or physically shielded from the field or force being sensed or is in some manner made unresponsive to the sensed parameter. An equal excitation or drive signal is then applied to both the components comprising the active transducer and the components comprising the duplicate passive transducer on the signal conditioner. The output of the signal conditioner passive transducer is then relative only to temperature and is then subtracted from the output of the active transducer that responds to the field or force. This is usually accomplished in a differential amplifier or a similar electronic circuit.

A second method, for example, can be used where space for the signal conditioner is more limited. A representative part of the transducer at any proportion can be duplicated on the signal conditioner. This representative part can be chosen to be a part that is unresponsive to the parameter being sensed or can be physically oriented to a position where it is not affected or otherwise shielded from the parameter being sensed. In any case, it is designed so its electrical conductivity is proportional only to changes in temperature. The change of the transducer output due to the cumulative changes of electrical conductivity of all transducer components due only to changes in temperature is determined by direct measure or by mathematical calculation during the sensor design phase. This yields a specific level of transducer output change per degree of change in temperature. This information is used to design a circuit with a specific amount of gain determined by the relationship of the change in electrical conductivity of the signal conditioner duplicate component to the change in transducer output caused by a change in temperature. This circuit monitors the change in electrical conductivity of the signal conditioner duplicate component and then amplifies this change by the amount required to yield an equivalent signal level change that is then subtracted from the transducer output as above.

Long term changes of electrical conductivity are a second significant problem in semiconductor components. This is usually caused by electromigration of the atoms of the material comprising the components from their positions as manufactured along paths of electrical current into areas that are not designed to contain them. For instance, the atoms comprising the base structure of a transistor can migrate into the areas occupied by the emitter and the collector, and vice versa. This changes both the physical size of the component as well as its concentration of the materials comprising the component. Any component in the transducer will experience these effects the same as an identical component in the signal conditioner provided the current through both components is kept equal over the life of the sensor. This is felt the same way as the short term effects of temperature as above by both components in the transducer and in the signal conditioner and is thus effectively compensated for in the same manner as short term changes in temperature.

During the manufacturing process, both the transducer and the signal conditioner are formed on a common surface on the wafer known as the planar surface. Since components are not usually formed on top of other components, this results in transducers and signal conditioners that have a large surface area relative to the depth of the devices. The area taken up by these devices is generally measured along this planar surface. The depth of all such semiconductor devices is usually fixed by design considerations and is not relative to the number of devices.

Prior art sensors generally manufacture the signal conditioner and transducer on the same wafer and interconnect the two using conductive traces defined directly on the wafer. The prior art sensors are then installed as a single monolithic chip in the sensor. Since the transducer generally should be oriented in a specific direction relative to the field being sensed, this requires that the signal conditioner be oriented also to the field in like manner.

Also, the amount of area occupied by the transducer is much smaller than the area occupied by the signal conditioner. Orientation of both a transducer and a signal conditioner along the same plane generally produces a larger cross section for the sensor than could be achieved by orienting the transducer to the field and orienting the signal conditioner separately in whatever direction needed to realize the smallest cross section. Because the signal conditioner does not require a specific orientation in relation to the field, a much smaller cross section in relation to a specific direction of measurement can be realized by changing the orientation of the transducer and signal conditioner so they are orthogonal. This can only be accomplished if the transducer and signal conditioner are physically separated and electrically connected using some means other than the conductive traces so the transducer can be oriented to the field or force separately from the signal conditioner.

SUMMARY OF THE INVENTION

With the foregoing in mind, the present invention advantageously provides a compact sensing apparatus that achieves a smallest cross section in relation to a defined axis. The present invention also advantageously provides a compact sensing apparatus and method which simplify manufacture of a sensing apparatus or sensor by providing means for orienting the transducer in a selected direction in relation to the signal conditioner.

The present invention accomplishes these objects and advantages relating to field orientation by positioning a transducer in a specific orientation relative to a signal conditioner in a sensing apparatus. The transducer and signal conditioner can be manufactured simultaneously on a semiconductor wafer and means are employed to either leave the transducer and signal conditioner oriented as manufactured or to arrange them physically at right angles to each other to provide the maximum sensitivity to the field for the transducer and the minimum cross section for the sensing apparatus along its axis of orientation.

The present invention also accomplishes the objects and advantages of the orientation of the transducer and signal conditioner by employing electrically conductive pins that are rigid. The pins provide electrical connection between the transducer and the signal conditioner and between the signal conditioner and external sensor monitoring equipment.

More particularly, a compact sensing apparatus according to the present invention preferably includes plurality of mounting pins. Each of the plurality of mounting pins preferably includes a first pin portion and a second pin portion connected to the first pin portion at a predetermined angle. The first pin portion preferably has a length less than the second pin portion, and the predetermined angle is preferably less than 180 degrees and more preferably in the range of about 70–110 degrees. A transducer is formed from a semiconductor wafer mounted to the first pin portion for generating a transducer signal. Signal conditioning means also is formed from the same semiconductor wafer and mounted to the second pin portion for conditioning the transducer signal.

A compact sensing apparatus according to another aspect of the present invention preferably includes a plurality of mounting pins. Each of the plurality of mounting pins includes a first pin portion and a second pin portion connected to the first pin portion at a predetermined angle. The first pin portion preferably has a length less than the second pin portion. A transducer is mounted to the first pin portion for generating a transducer signal. A signal conditioner is mounted to the second pin portion for conditioning the transducer signal. The signal conditioner is preferably mounted to the second pin portion so that the lateral extent of the signal conditioner is generally perpendicular to the lateral extent of the transducer.

According to other aspects of the present invention, a compact sensing apparatus has the plurality of mounting pins which are defined by a plurality of spaced-apart and elongate mounting pins. The lengthwise extent of each of the plurality of spaced-apart and elongate mounting pins is spaced-apart from and generally parallel to the lengthwise extent of another one of the plurality of pins. The plurality of spaced-apart and elongate mounting pins include a plurality of generally coaxially aligned and laterally spaced-apart mounting pins. Each of the laterally spaced-apart portions extending between the generally coaxially aligned mounting pins is positioned at a different lengthwise extending location than another generally parallel and spaced apart plurality of elongate mounting pins so that at least two of the laterally spaced-apart portions define a plurality of staggered gaps extending between the generally coaxially aligned mounting pins. The plurality of staggered gaps thereby advantageously form electrical isolation between the plurality of generally coaxially aligned mounting pins and thereby increase the stiffness of the sensing apparatus. The plurality of mounting pins are each formed of an electrically conductive rigid material and positioned so as to define electrical connectors for the transducer and the signal conditioning means and to provide physical support for the transducer and the signal conditioning means mounted thereto.

Additionally, each of the transducer and the signal conditioning means are preferably formed on the same surface, e.g., the upper surface, of the same semiconductor wafer substrate. A plurality of bonding pads are also formed on the upper surface of the same semiconductor wafer substrate for bonding the transducer and the signal conditioning means to the plurality of mounting pins. Also, a plurality of conductive traces are preferably formed in the same substrate to provide conductive paths between the transducer and the signal conditioning means. The transducer can include a planar surface for more sensitively sensing a field having flux lines extending either generally perpendicular to the planar surface or generally parallel to the planar surface.

According to still another aspect of the present invention, the first and second pin portions of each of the plurality of mounting pins of the compact sensing apparatus preferably is a single unitary pin. The single unitary pin preferably includes a bend formed therein having an angle of bend defining the predetermined angle of orientation of the first and second pin portions. The transducer can also include a channel formed closely adjacent an edge thereof for adaptively positioning the transducer closely adjacent the bend so that the transducer adaptively clears the bend of each of the plurality of mounting pins. The transducer advantageously can be connected to either a forwardly extending surface of the first pin portion which extends away from the signal conditioning means or to a rearwardly extending surface of the first pin portion which extends toward said signal conditioning means or to either of two surfaces on the second pin portion.

The present invention also includes methods of compactly mounting a sensing apparatus. The method preferably includes the steps of forming a transducer and a signal conditioner from the same semiconductor wafer and providing at least two mounting surfaces. The at least two mounting surfaces are oriented with respect to each other at a predetermined angle. The predetermined angle is preferably less than 180 degrees and more preferably is in the range of about 70–110 degrees. The method also includes connecting the transducer to one of the at least two mounting surfaces and connecting the signal conditioner to another one of the at least two mounting surfaces.

Another method of compactly mounting a sensing apparatus according to the present invention preferably includes providing a transducer and a signal conditioner and positioning the signal conditioner so that the lateral extent thereof is generally perpendicular to the lateral extent of the transducer. The transducer and the signal conditioner are each respectively mounted on at least two mounting surfaces. The at least two mounting surfaces are preferably oriented with respect to each other at a predetermined angle.

BRIEF DESCRIPTION OF THE DRAWINGS

Some of the features, advantages, and benefits of the present invention having been stated, others will become apparent as the description proceeds when taken in conjunction with the accompanying drawings in which:

FIG. 6 is an isometric view of a compact sensing apparatus with an orthogonal transducer and signal conditioner arranged for minimal cross section according to a second embodiment of the present invention;

FIG. 7a is a top plan view of a transducer and a signal conditioner formed on the same semiconductor wafer of a compact sensing apparatus according to embodiments of the present invention;

FIG. 7b is a side elevational view of a transducer and a signal conditioner formed on the same semiconductor wafer of a compact sensing apparatus according to embodiments of the present invention;

FIG. 10 is an isometric view of a compact sensing apparatus which illustrates the arrangement of a plurality of mounting pins, a transducer, and a signal conditioner for a sensing apparatus with the transducer positioned generally orthogonal to the signal conditioner on a sensing apparatus according to another alternative embodiment of the present invention; and FIG. 11 is an isometric view of a compact sensing apparatus which illustrates the arrangement of a plurality of mounting pins, a transducer, and a signal conditioner for a sensing apparatus with the transducer positioned generally orthogonal to the signal conditioner on a sensing apparatus for operation according to yet another embodiment of the present invention.

DETAILED DESCRIPTION OF PREFERRED EMBODIMENTS

The present invention will now be described more fully hereinafter with reference to the accompanying drawings which illustrate preferred embodiments of the invention. This invention may, however, be embodied in many different forms and should not be construed as limited to the illustrated embodiments set forth herein. Rather, these illustrated embodiments are provided so that this disclosure will be thorough and complete, and will fully convey the scope of the invention to those skilled in the art. Like numbers refer to like elements throughout, the prime notation, if used, indicates similar elements in alternative embodiments.

Figure 1:
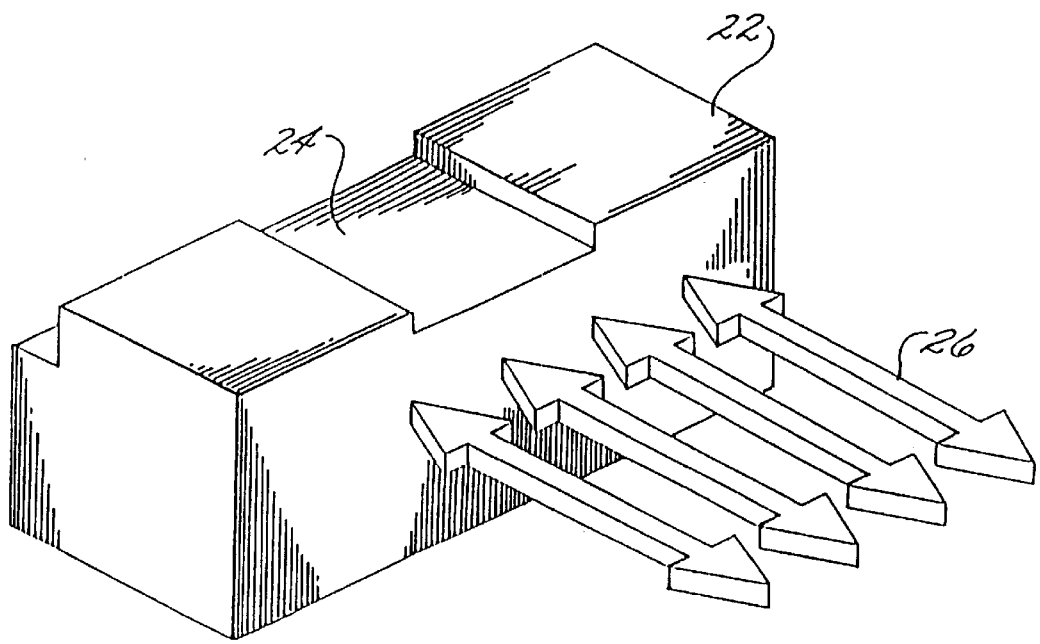
FIG. 1 is an isometric view of a transverse transducer showing relative orientation of the field being sensed in relation to the planar surface of the transducer of a compact sensing apparatus according to a first embodiment of the present invention.
Figure 2:
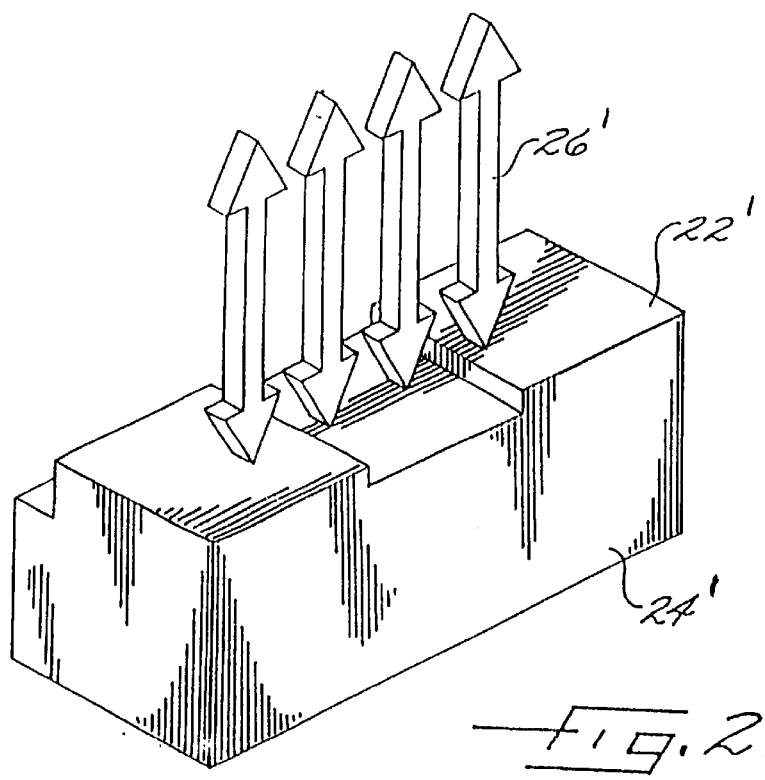
FIG. 2 is an isometric view of an orthogonal transducer showing relative orientation of the field being sensed in relation to the planar surface of the transducer of a compact sensing apparatus according to a second embodiment of the present invention.

FIGS. 1–2 illustrate field sensing transducers 22,22' including planar surfaces 24, 24' and electric or magnetic fields 26, 26' of a compact sensing apparatus according to first and second embodiments of the present invention. For simplicity, the field sensing transducers 22, 22' will be referred to as transducers 22, and electric or magnetic fields 26, 26' will be referred to simply as fields 26. As understood by those skilled in the art, there are numerous types of transducers 22 that sense the presence or magnitude of electrical or magnetic fields 26 which can be used in the compact sensing apparatus of the present invention. These transducers 22 are usually fabricated on semiconductor wafers by deposition of material onto the planar surface 24 of the wafer. These transducers 22 generate electrical signals in proportion to the number of lines of flux of the field 26 that pass through the material of the transducer 22 in a preferred direction relative to the transducer's planar surface 24.

Some transducers 22, however, are more sensitive to fields 26 that are generally parallel to this planar surface 24, and others are more sensitive to fields 26 that are generally perpendicular to the planar surface 24. Also for simplicity, the transducers 22 whose preferred field 26 direction is generally perpendicular to the planar surface 24 will be referred to as orthogonal transducers 22, and transducers 22 whose preferred field 26 direction is generally parallel to the planar surface 24 will be referred to as transverse transducers 22.

An example of a transverse transducer 22 that senses fields 26 oriented generally parallel to its planar surface 24 is a magnetoresistor. Examples of orthogonal transducers 22 that sense fields 26 oriented generally perpendicular to their planar surfaces 24 are magnetic sensors such as Hall effect cells and electrical sensors such as capacitive transducers 22. A difference between these two sensors, for example, is that the Hall effect cell detects magnetic fields and the capacitive transducer detects electrical fields.

FIG. 1, on the one hand, illustrates the field 26 of a transverse transducer 22, or one with maximum sensitivity attained when the field 26 is generally parallel or transverse to the planar surface 24 of the transducer 22. FIG. 2, on the other hand, shows the field 26 of an orthogonal transducer 22, or one with maximum sensitivity when the field 26 is generally perpendicular or orthogonal to the planar surface 24 of the transducer 22. As understood by those skilled in the art, numerous other types of transverse and orthogonal transducers 22 also exist and can be used according to the present invention. Specifically, these may be inductive sensors, planar antenna arrays, light transducers, or any other electromagnetic sensor. In like manner, transducers that respond to physical forces in a preferred direction, such as micro-machined pressure sensors, flow sensors, or accelerometers also can be configured for a minimum cross section 34 according to the present invention. In examples of sensors that sense physical forces, the lines of flux of the field 26 can be considered to be the lines of the force or forces being sensed for the purposes of this invention.

Figure 3:
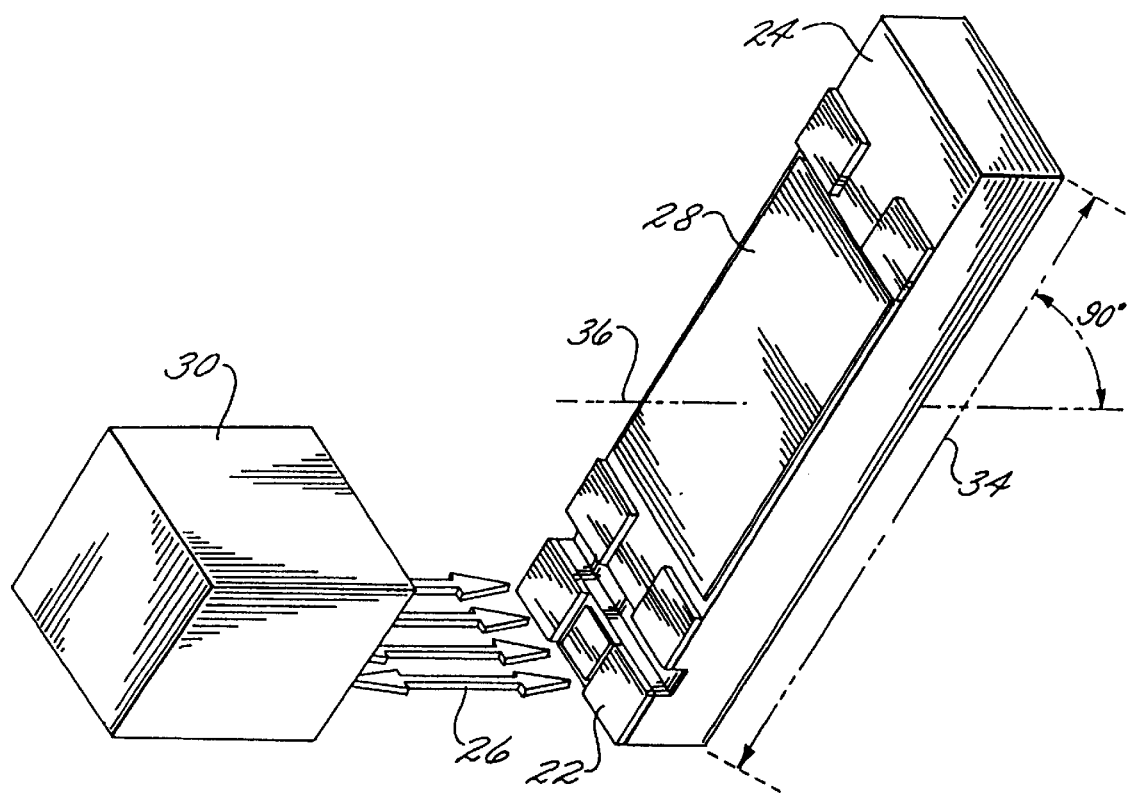
FIG. 3 is an isometric view of an orthogonal transducer and signal conditioner on the same planar surface of an integrated circuit chip of a compact sensing apparatus according to a second embodiment of the present invention.

FIG. 3 illustrates an arrangement of an orthogonal transducer 22 and signal conditioning means, e.g., preferably provided by a signal conditioner 28 or signal conditioning circuitry, formed on the planar surface 24 of a semiconductor wafer in relation to a target 30, a field 26, a sensor cross section 34, and a sensor axis 36 for a compact sensing apparatus 32 with the transducer 22 and the signal conditioner 28 joined as manufactured on the wafer. For the purposes of this discussion, the target 30 will be considered to be any object that either generates fields 26 or forces or that by changes in physical or electromagnetic properties causes a change in the magnitude or flux density of the field 26 or the forces at the planar surface 24 of the transducer 22. Also, for the purposes of this description, the cross section 34 of the compact sensing apparatus 32 is defined to be generally perpendicular to the sensor axis 36. The sensor cross section 34 is further defined to be the diameter of the smallest circle encompassing all parts of the sensor 32 drawn at a right angle to the sensor axis 36.

Generally, the least expensive method of mounting a sensing apparatus 32 in a mechanical or electrical system is to drill a hole in a desired mounting structure and secure the sensing apparatus 32 in the hole. In most systems, the hole must be kept as small as possible to decrease manufacturing costs, to reduce the size of the system as much as possible, and to provide the maximum possible amount of material surrounding the hole in order to provide the maximum mechanical stiffness for the system. To make this hole as small as possible, the components of the sensing apparatus 32 preferably should be arranged to provide the smallest cross section 34 for the sensing apparatus 32 when the sensor axis 36 is aligned with the central axis of the hole.

Often, the signal from the transducer 22 is too weak to overcome external noise, is changed significantly by changes in temperature, contains a large offset, or in some other manner is inadequate for direct connection to remote sensor monitoring equipment. In these cases the signal is modified by a signal conditioner 28 which is preferably placed as closely as possible to the transducer 22. To allow the signal conditioner 28 to best compensate for changes in transducer 22 signal levels due to changes in temperature, the signal conditioner 28 and transducer 22 are preferably manufactured on the same semiconductor wafer. In this manner, any process variations encountered during the manufacturing process will cause the changes in temperature to be felt equally by both the transducer 22 and the signal conditioner 28. If the transducer 22 and signal conditioner 28 are kept at the same temperature, this allows the signal conditioner 28 to cancel the effects of transducer 22 signal change as a result of changes in temperature. For modem microelectronic sensors, this generally means that the planar surface 24 of the transducer 22 is preferably the same as the planar surface 24 of the signal conditioner 28.

FIG. 3 shows the arrangement of a compact sensing apparatus 32 employing an orthogonal transducer 22 arranged to monitor a target 30 that generates or modifies a field 26 that is parallel to the sensor axis 36. Note that if the signal conditioner 28 and transducer 22 are manufactured as a single chip as shown, this arrangement results in a cross section 34 that includes the area required by both the transducer 22 and the signal conditioner 28. This results in a significantly larger cross section 34 than would be required for the transducer 22 alone.

Figure 4:
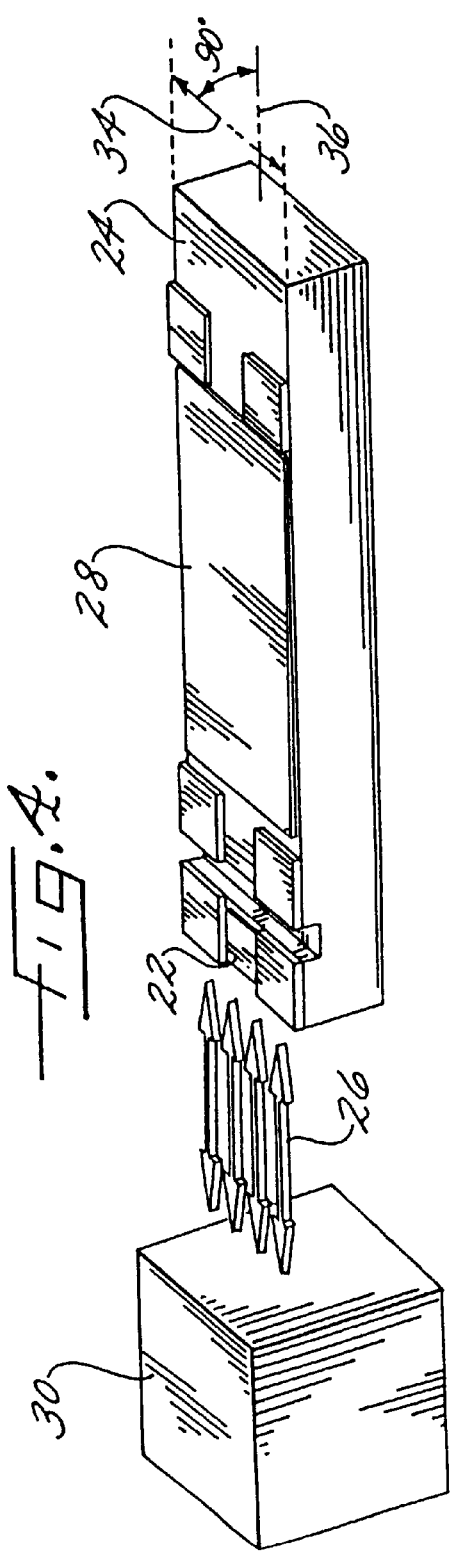
FIG. 4 is an isometric view of a transverse transducer and signal conditioner on the same planar surface of an integrated circuit chip of a compact sensing apparatus according to a first embodiment of the present invention.
Figure 5:
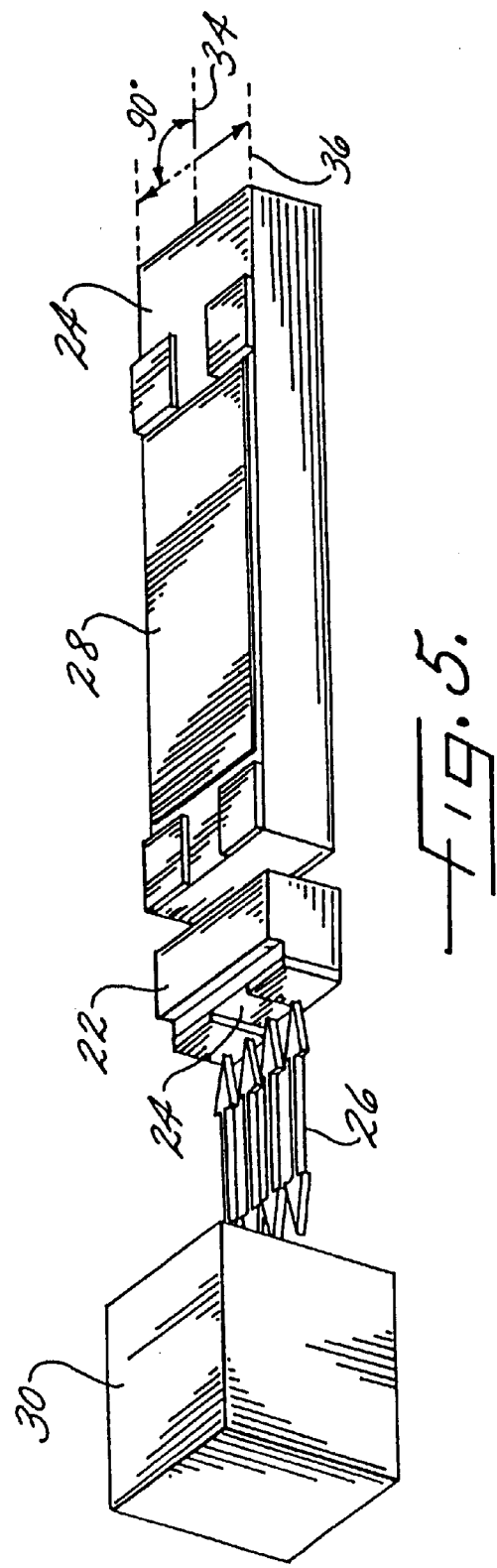
FIG. 5 is an isometric view of a compact sensing apparatus with an orthogonal transducer and signal conditioner arranged for minimal cross section according to a second embodiment of the present invention.

FIG. 4 illustrates an arrangement of a compact sensing apparatus 32 utilizing a transverse transducer 22 to monitor a field 26 parallel to the sensor axis 36. Note that the cross section 34 for this arrangement is significantly smaller than the cross section 34 for the sensing apparatus 32 shown in FIG. 3. FIG. 5, on the other hand, illustrates a method of arranging or compactly mounting an orthogonal transducer 22 and signal conditioner 28 to realize the smallest possible cross section 34 for the sensing apparatus 32. This is accomplished by physically separating the transducer 22 and signal conditioner 28 and then mounting the signal conditioner 28 so its planar surface 24 is positionally aligned with the sensor axis 36.

FIG. 6 illustrates an arrangement for an orthogonal transducer 22 employed to sense a field 26 that is perpendicular to the sensor axis 36. Note this method of arrangement does not differ from the arrangement shown in FIG. 3 except that the transducer 22 and signal conditioner 28 chips are two separate objects. This allows the transducer 22 to be fabricated from different semiconductor materials or in a different process than the signal conditioner 28. If the transducer 22 and signal conditioner 28 are manufactured on the same semiconductor wafer, the arrangement shown in FIG. 3 is preferred because it requires fewer manufacturing steps.

FIGS. 7a and 7b respectively are a top plan view and a side elevational view of the formation of a sensing apparatus 32 on the planar surface 24 of a semiconductor wafer. Note that although only one chip is shown, many such identical chips are formed on the same wafer simultaneously. Note also that the chip is shown after being cut apart from each other sensor or transducer chip so formed on the wafer. The transducer 22 and signal conditioner 28 are formed on the planar surface 24 using semiconductor fabrication techniques well known in the art. Additionally, conductive traces 38 are formed to provide electrical connection between the transducer 22 and the signal conditioner 28 and between the signal conditioner 28 and the remote sensor monitoring equipment. Before these conductive traces 38 are applied, however, an etched channel 42 is preferably formed by masking and etching processes as understood by those skilled in the art. Bond pads 40 are added to provide electrical connection to other devices or between the transducer 22 and signal conditioner 28 if they are to be separated (also note the optional cutting path 44). If the sensing apparatus 32 is to be fabricated as a single monolithic device as shown in FIG. 4, this cut is not made. If the transducer 22 is to be oriented as shown in FIG. 5 or FIG. 6, however, the transducer 22 and signal conditioner 28 are cut apart along the line shown.

Figure 8:
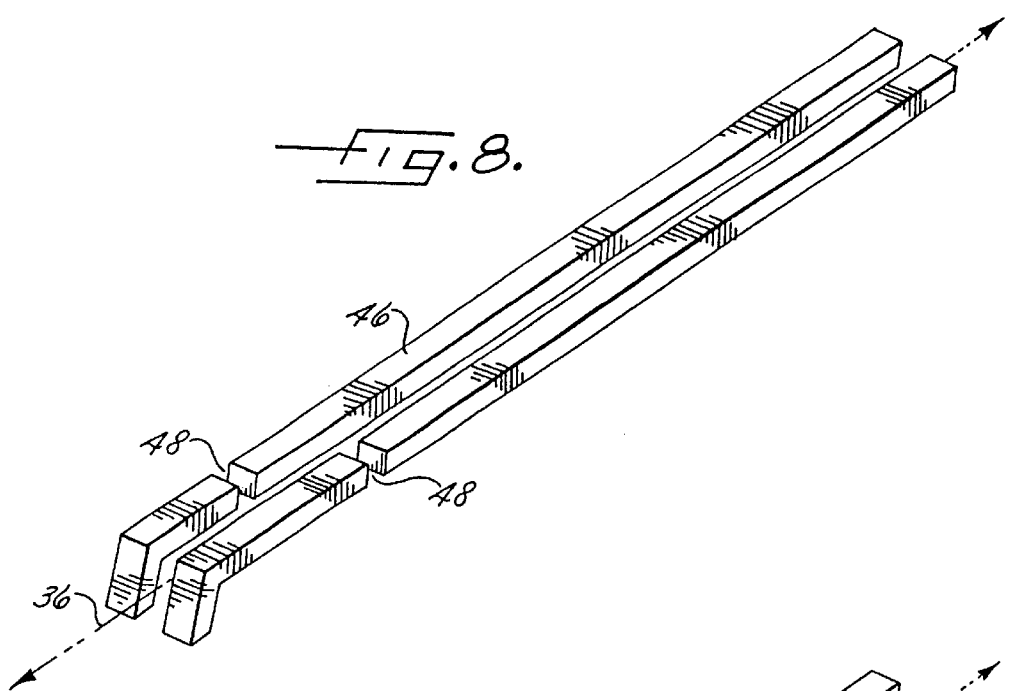
FIG. 8 is an isometric view of a plurality of mounting pins used to electrically connect a transducer and a signal conditioner of a compact sensing apparatus according to embodiments of the present invention.

FIG. 8 is an isometric view of a plurality of spaced-apart and elongate mounting pins 46 used to connect the transducer 22 to the signal conditioner 28 and to connect the signal conditioner 28 to external sensor monitoring equipment. Each of the plurality of mounting pins 46 preferably include a first pin portion and a second pin portion connected to the first pin portion at a predetermined angle. As illustrated, the first pin portion preferably has a length less than the second pin portion, but this may vary depending on the staggered gaps, for example, as described further below herein. The predetermined angle is preferably in the range of about 70–110 degrees, and more particularly at about right angles, e.g., 85–95 degrees. The transducer formed from a semiconductor wafer is preferably mounted to the first pin portion for generating a transducer signal. The signal conditioner, preferably formed from the same semiconductor wafer as the transducer, is preferably mounted to the second pin portion for conditioning the transducer signal (see also FIGS. 10–11).

The lengthwise extent of each of the plurality of spaced-apart and elongate mounting pins 46 is preferably spaced-apart from and generally parallel to the lengthwise extent of another one of the plurality of pins 46. The plurality of mounting pins 46 include a plurality of generally coaxially aligned and laterally spaced-apart mounting pins. Preferably, as illustrated, at least two of the mounting pins 46, or pin portions, turn at approximate right angles to connect the transducer 22 to the signal conditioner 28, and at least two of the mounting pins are relatively straight to connect the signal conditioner 28 to external sensor monitoring equipment. Each of the laterally spaced-apart portions extending between the generally coaxially aligned mounting pins is positioned at a different lengthwise extending location than another generally parallel and spaced apart plurality of elongate mounting pins so that at least two of the laterally spaced-apart portions define a plurality of staggered gaps 48 extending between the generally coaxially aligned mounting pins. The plurality of staggered gaps 48 thereby form electrical isolation between the plurality of generally coaxially aligned mounting pins and thereby increase the stiffness of the sensing apparatus. These gaps are staggered so they are not both in the same plane that is orthogonal to the sensor axis 36 to provide mechanical support for or increase the stiffness of the sensing apparatus 32 so it is less likely to bend along the sensor axis 36.

Figure 9:
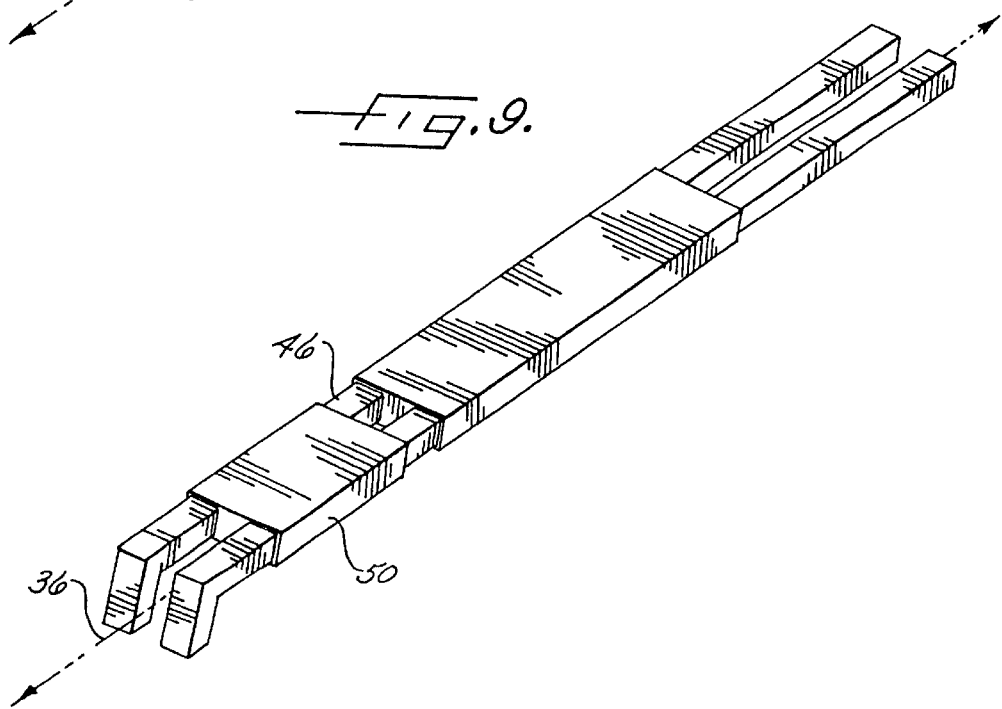
FIG. 9 is an isometric view of the formation of insulating material used to prevent electrical shorts and to hold a plurality of mounting pins in place for a compact sensing apparatus according to embodiments of the present invention.

As perhaps best illustrated in FIG. 9, insulation 50 is preferably applied to the pins 46 on all areas that do not require a direct electrical path to the transducer 22, the signal conditioner 28, or to external monitoring equipment. Since the insulation 50 is usually not rigid, the staggered gaps 48 between the pins 46 still serve to help prevent the sensor connector 52 from bending during manufacture.

In some sensor applications, the magnetic field 26 changes more significantly for a given set of operating parameters when a magnet is placed behind the transducer 22 relative to the target 30. For these applications, FIG. 10 illustrates the arrangement of a transducer 22 and mounting pins 46 according to an alternative embodiment of a sensing apparatus 32. Here the transducer 22 has its planar surface 24 rotated and placed against the pins 46 at a point closest to the target 30. An electrical connection is made to the bond pads 40 and mechanical support for the chips is realized through the use of conductive epoxies, solder bumps, or some other appropriate method as understood by those skilled in the art. In these applications the field 26 penetrates the transducer 22 from the side opposite its planar surface 24. This arrangement also makes the transducer 22 as sensitive to the field 26 as possible by placing the planar surface 24 of the transducer 22 as close as possible to the target 30 or to the source of the field 26.

According to another embodiment a sensing apparatus 32 and associated mounting method are shown in FIG. 11. This arrangement places the transducer 22 so that the pins 46 are between the target 30 and the transducer 22. This arrangement is generally used where the field 26 is more advantageously modified by the pins 46 being in this position; where the transducer 22 planar surface 24 is to be protected by the pins 46; or where more precise mechanical alignment of the transducer 22 is desired. Since the pins 46 generally have some small but finite inner bend radius, the etched channel 42 serves to form a void between the transducer 22 and the pins 46 to allow the transducer 22 to fit flush against the pins 46 along the flat surface of the pins 46 without interference.

For either of the embodiments of a sensing apparatus 32 described above with reference to FIG. 10 or FIG. 11, the signal conditioner 28 is preferably placed in the position shown. It is mechanically attached and electrically connected to the pins 46 the same way as the transducer 22. Two bond pads 40 preferably connect through the mounting pins 46 to the transducer 22, and two bond pads 40 connect through the straight pins 46 to external monitoring equipment. Neither drawing shows the actual bonding method used because the material used to form the bond is usually applied during chip fabrication and as such is considered an integral part of the bond pads 40.

Advantageously, a compact sensing apparatus 32 according to the present invention as described herein can be used to physically arrange and electrically connect transducers 22 and signal conditioners 28 or any other such electrical devices requiring electrical interconnection in the same basic arrangement shown herein. Also, although only two mounting pins 46 are shown connecting the transducer 22 to the signal conditioner 28, and two mounting pins 46 are shown connecting the signal conditioner to external monitoring equipment, any number of pins or pin portions can be used as required.

As illustrated in FIGS. 1–11, the present invention also includes methods of compactly mounting a sensing apparatus 32. A method of mounting according to the present invention preferably includes the steps of forming a transducer 22 and a signal conditioner 28 from the same semiconductor wafer and providing at least two mounting surfaces, e.g., on the mounting pins 46. The at least two mounting surfaces are oriented with respect to each other at a predetermined angle. The predetermined angle is preferably less than 180 degrees and more preferably is in the range of about 70–110 degrees. The method also includes connecting the transducer 22 to one of the at least two mounting surfaces and connecting the signal conditioner 28 to another one of the at least two mounting surfaces. The method can additionally include the at least two mounting surfaces being mounting surfaces on a plurality of mounting pins 46. Each of the plurality of mounting pins 46 includes a first pin portion and a 15 second pin portion connected to the first pin portion at the predetermined angle. The first pin portion has a length less than the second pin portion. The connecting step preferably includes mounting the transducer 22 to a surface of the first pin portion, and the signal conditioner connecting step includes mounting the signal conditioner 28 to a surface of the second pin portion. The first and second pin portions of each of the plurality of mounting pins comprise a single unitary pin. The single unitary pin includes a bend formed therein having an angle of bend defining the predetermined angle of orientation of the first and second pin portions. Also, a channel 42 is formed in the transducer 22, e.g., preferably by etching, closely adjacent an edge thereof and adaptively positioning the transducer 22 closely adjacent the bend so that the transducer 22 adaptively clears the bend of each of the plurality of mounting pins 46.

The method can further include separating the transducer 22 from the signal conditioner 28 such as along a preselected cutting path 44 and positioning the signal conditioner 28 so that the lateral extent thereof is generally perpendicular to the lateral extent of the transducer 22. A plurality of bonding pads 40a, 40b, 40c, 40d, 40e and 40f can be formed on the same semiconductor wafer also so that the pads serve to mechanically and electrically bond the transducer and the signal conditioner to the mounting surfaces. Also, a plurality of conductive traces 38a, 38b are also formed on the same semiconductor wafer for providing a conductive path between the transducer 22 and the signal conditioner 28 in the special case wherein the transducer 22 and the signal conditioner 28 are not physically separated.

Another method of compactly mounting a sensing apparatus 32 according to the present invention preferably includes providing a transducer 22 and a signal conditioner 28 and positioning the signal conditioner 28 so that the lateral extent thereof is generally perpendicular to the lateral extent of the transducer 22. The transducer 22 and the signal conditioner 28 are each respectively mounted on at least two mounting surfaces. The at least two mounting surfaces are preferably oriented with respect to each other at a predetermined angle such as described above herein.

The method can also include connecting the transducer 22 to one of the at least two mounting surfaces and connecting the signal conditioner 28 to another one of the at least two mounting surfaces. The at least two mounting surfaces preferably are mounting surfaces on a plurality of mounting pins 46. Each of the plurality of mounting pins 46 includes a first pin portion and a second pin portion connected to the first pin portion at the predetermined angle. The first pin portion has a length less than the second pin portion. The transducer 22 connecting step includes mounting the transducer 22 to a surface of the first pin portion, and the signal conditioner connecting step includes mounting the signal conditioner 28 to a surface of the second pin portion.

The first and second pin portions of each of the plurality of mounting pins 46 preferably are a single unitary pin, and the single unitary pin preferably includes a bend formed therein having an angle of bend defining the predetermined angle of orientation of the first and second pin portions. A channel 42 is also provided for the transducer 22 closely adjacent an edge thereof, and the transducer 22 is adaptively positioned closely adjacent the bend so that the transducer 22 adaptively clears the bend of each of the plurality of mounting pins 46.

The method additionally can include providing a plurality of bonding pads 40a, 40b, 40c, 40d, 40e and 40f for each of the transducer 22 and the signal conditioner 28 for bonding the transducer 22 and the signal conditioner 28 to the mounting surfaces and forming a plurality of conductive traces 38a, 38b for providing a conductive path between the transducer 22 and the signal conditioner 28.

In the drawings and specification, there have been disclosed a typical preferred embodiment of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the appended claims.

That which is claimed:

1. A compact sensing apparatus comprising:
 a transducer formed from a semiconductor wafer, positioned in a first plane;
 a signal conditioner formed from the same semiconductor wafer as the transducer, electrically connected to the transducer, and positioned with respect to the transducer at a predetermined angle in a second plane, the predetermined angle being about 70–110 degrees; and
 at least two elongate mounting pins carried in a spaced relations each elongate mounting pin connecting the transducer to the signal conditioner, thus positioning the first plane at the predetermined angle to the second plane.

2. A compact sensing apparatus as defined in claim 1, further comprising a plurality of bonding pads formed on the same semiconductor wafer for each of the transducer and the signal conditioner for bonding the transducer and the signal conditioner to thereby provide a conductive path between the transducer and the signal conditioner.

3. A compact sensing apparatus comprising:
 a transducer formed from a semiconductor wafer positioned in a first plane;
 a signal conditioner formed from a semiconductor wafer, electrically connected to the transducer, and positioned with respect to the transducer at a predetermined angle in a second plane, the predetermined angle being less than 180 degrees; and
 at least two elongate mounting pins carried in a spaced relation, each elongate mounting pin connecting the transducer to the signal conditioner, thus positioning the first plane at the predetermined angle to the second plane.

4. A compact sensing apparatus as defined in claim 3, wherein the transducer and the signal conditioner are formed from the same semiconductor wafer, and the apparatus further comprising a plurality of bonding pads formed on the same semiconductor wafer for each of the transducer and the signal conditioner for bonding the transducer and the signal conditioner to thereby provide a conductive path between the transducer and the signal conditioner.

5. A compact sensing apparatus comprising:
 a transducer formed from a semiconductor wafer positioned in a first plane, the transducer having a substantially planar outer surface to more sensitively sense a field having flux lines extending substantially perpendicular to the planar outer surface;
 a signal conditioner formed from the same semiconductor wafer in electrical communication with the transducer, and positioned with respect to the transducer at a predetermined angle in a second plane, the predetermined angle being less than 180 degrees;
 at least one conductor electrically connected to the signal conditioner to connect the signal conditioner to external sensor monitoring equipment; and
 at least two elongate mounting pins carried in a spaced relation, each elongate mounting pin connecting the transducer to the signal conditioner, thus positioning the first plane at the predetermined angle to the second plane.

6. A compact sensing apparatus as defined in claim 1, wherein each elongate mounting pin includes a first and second pin portions forming the predetermined angle therebetween, the first pin portion securing the transducer thereto and the second pin portion securing the signal conditioner thereto for positioning the first plane at the predetermined angle to the second plane.

7. A compact sensing apparatus as defined in claim 3, wherein each elongate mounting pin includes a first and second pin portions forming the predetermined angle therebetween, the first pin portion securing the transducer thereto and the second pin portion securing the signal conditioner thereto for positioning the first plane at the predetermined angle to the second plane.

8. A compact sensing apparatus as defined in claim 5, wherein each elongate mounting pin includes a first and second pin portions forming the predetermined angle therebetween, the first pin portion securing the transducer thereto and the second pin portion securing the signal conditioner thereto for positioning the first plane at the predetermined angle to the second plane.

* * * * *